(12) United States Patent
Aoyama et al.

(10) Patent No.: US 7,733,460 B2
(45) Date of Patent: Jun. 8, 2010

(54) ALIGNER AND SELF-CLEANING METHOD FOR ALIGNER

(75) Inventors: Ryoichi Aoyama, Tokyo (JP); Daigo Hoshino, Miyagi (JP); Toshio Onodera, Tokyo (JP); Yasuhiro Yamamoto, Miyagi (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 1232 days.

(21) Appl. No.: 11/285,211

(22) Filed: Nov. 23, 2005

(65) Prior Publication Data

US 2007/0240735 A1 Oct. 18, 2007

(30) Foreign Application Priority Data

Nov. 24, 2004 (JP) .............................. 2004-338573

(51) Int. Cl.
*G03B 27/52* (2006.01)
*G03B 27/42* (2006.01)

(52) U.S. Cl. .......................................... 355/30; 355/53

(58) Field of Classification Search ................... 355/30, 355/53, 67; 250/492.2; 359/742–743
See application file for complete search history.

(56) References Cited

U.S. PATENT DOCUMENTS

| | | | |
|---|---|---|---|
| 6,268,904 B1 * | 7/2001 | Mori et al. | 355/53 |
| 6,411,368 B1 * | 6/2002 | Matsumoto et al. | 355/67 |
| 6,980,278 B2 * | 12/2005 | Aoyama et al. | 355/53 |
| 7,362,414 B2 * | 4/2008 | Singer et al. | 355/30 |

FOREIGN PATENT DOCUMENTS

| | | |
|---|---|---|
| JP | 05-335206 | 12/1993 |
| JP | 10-335235 | 12/1998 |
| JP | 10-335236 | 12/1998 |
| JP | 2000-091207 | 3/2000 |
| JP | 2002-164267 | 6/2002 |

* cited by examiner

*Primary Examiner*—Hung Henry Nguyen
(74) *Attorney, Agent, or Firm*—Rabin & Berdo, P.C.

(57) ABSTRACT

When a self-cleaning method for an aligner is carried out, a reflecting plate having a convex lens portion is set in an original plate holder, and exposure light rays are irradiated from a light source. The surface of the lens portion is coated with a reflective film. The light rays are reflected by the reflecting plate, diffused, and emitted onto the surface of a condenser lens, thereby breaking down and removing contaminants that are adhered to the surface of the condenser lens. The light rays also enter the interior of the condenser lens to clean away contaminants that are adhered to locations other than a normal exposure path. When a concave mirror and/or a reflecting plate having 50% transmittance is used as the reflecting plate, the emission range of the light rays (i.e., the locations that are cleaned) can be changed.

14 Claims, 10 Drawing Sheets

10C
15: FRESNEL LENS
4B
4B

15R: REFLECTIVE FILM 10D
12: LENS PORTION
5B

12HR: REFLECTIVE FILM

ALIGNER AND SELF-CLEANING METHOD FOR ALIGNER

BACKGROUND OF THE INVENTION

1. Field of the Invention

The present invention relates to a self-cleaning method for an aligner (lithograph apparatus), and an aligner.

2. Description of the Related Art

During pattern formation of wires and elements in a semiconductor integrated circuit structure, photolithograpy technology is employed to perform patterning. Specifically, the pattern is formed by irradiating photoresist coated onto a semiconductor wafer with light using an aligner.

With the recent increase in the degree (density) of integration of semiconductor circuits, demands have been made for finer, higher density pattern formation. In response to these demands, techniques for reducing the wavelength of the exposure light source are progressing. At present, an ArF Exclmer light source having a wavelength of 193 nm, an F2 light source having a wavelength of 157 nm, and soft X rays such as EUV are either in practical use or under development.

With an aligner which performs fine, high-density pattern formation using this type of light source, contaminants in the air adhere to the surface of the optical components, causing adverse effects such as decreased illuminance and uneven illuminance. Therefore, a nitrogen purge is performed to reduce the effect of the contaminants. This purges the optical path with nitrogen gas at all times. However, even when the nitrogen purge is performed sufficiently, adverse effects such as decreased illuminance and uneven illuminance are caused by contamination of the optical components because the optical path system is exposed to the atmosphere during maintenance, and because contamination in fact occurs even during a normal exposure operation.

Hence, an aligner which employs an exposure light source having a particularly short wavelength adopts a self-cleaning method, which is known as optical cleaning. In this self-cleaning method, the optical system is irradiated with ultraviolet rays issued from a light source at a wavelength of no more than 200 nm. The intense energy of the ultraviolet rays severs the chemical bonds of the carbon compounds which are the main component of the contaminants adhered to the surface of the optical system, thereby breaking down the contaminants.

For example, Japanese Patent Application Kokai (Laid-Open) No. 5-335206 discloses a projection aligner including an illumination optical system for outputting illumination light, a filter which transmits only wavelengths that are useful for exposing, an exposure mask on which a desired exposure pattern is formed, a projection optical system for projecting the exposure pattern onto an object to be treated, a holder on which the object to be treated is mounted, and a stage for moving the holder relative to the projection optical system. During self-cleaning, an ultraviolet filter is positioned on the optical path in place of the filter and exposure mask, the holder is irradiated with the ultraviolet rays that pass through the ultraviolet filter via the projection optical system, and thus organic foreign bodies and impurities which have become adhered to the holder are oxidized and removed.

Similarly, Japanese Patent Application Kokai No 10-335235 and Japanese Patent Application Kokai No. 10-335236 disclose an aligner which is constituted such that light diffusing means or an optical path deflector may be disposed in the position of an exposure mask in order to form another optical path which is different from the optical path used during normal exposure.

Japanese Patent Application Kokai No. 2000-91207 discloses an oscillating concave mirror disposed on a stage for reflecting the light from the light source toward an optical system. Japanese Patent Application Kokai No. 2002-164267 discloses a plane mirror disposed on a stage for reflecting the light from the light source toward an optical system.

However, these conventional aligners have the following problems.

In Japanese Patent Application Kokai No. 5-335206, the ultraviolet filter is positioned on the optical path in place of the filter and exposure mask, and hence the ultraviolet rays used for optical cleaning are emitted onto the same location of the same path as those used during normal exposure. As a result, contaminants that are adhered to locations other than the normal exposure path cannot be cleaned away, and these remaining contaminants may move to the exposure optical path and produce adverse effects.

In Japanese Patent Application Kokai Nos. 10-335235, 10-335236, and 2000-91207, not only is the aligner complex, but moreover, existing aligners cannot be used. In Japanese Patent Application Kokai No. 2002-164267, the optical path irradiated with the light reflected by the plane mirror is limited, and hence it is difficult to achieve effective and desired cleaning.

SUMMARY OF THE INVENTION

An object of the present invention is to provide an aligner and a self-cleaning method for the aligner, with which contaminants that are adhered to locations other than the normal exposure path can be cleaned away in a simple manner.

According to one aspect of the present invention, there is provided an improved self-cleaning method for an aligner. The aligner includes a light source for outputting exposure light rays, an optical system for guiding the light rays from the light source to an exposure mask formed with an exposure pattern, and a projection lens for projecting the exposure pattern onto an object to be treated. The self-cleaning method includes providing a reflecting plate in a position in which the exposure mask is normally disposed, for reflecting the light rays guided by the optical system toward the optical system. The optical system is cleaned by irradiating the optical system with the light rays reflected by the reflecting plate.

The reflecting plate is, for example, a silica glass plate. The exposure mask is normally placed in an original plate (master plate) holder of the aligner. When self-cleaning the aligner, the silica glass plate is placed in the original plate holder. Preferably, the silica glass has a convex or concave lens portion on a surface thereof. Preferably, the lens portion of the silica glass plate is coated with a reflective film. Alternatively, the silica glass plate has a plurality of annular convex or concave lens segments disposed concentrically on the surface thereof. Preferably, the lens segments are coated with a reflective film. After mounting the silica glass plate in the original plate holder, the exposure light rays are output from the light source for self-cleaning.

The exposure light rays from the light source are introduced to the reflecting plate (e.g., silica glass plate) via the optical system. The light rays enter the reflecting plate, and are diffused or converged by the reflecting plate and then emitted onto the optical system. Hence the peripheral portion and interior of the optical system, to which the exposure light rays are not transmitted during normal exposure, are irradiated with the light rays. Thus the molecular bonds of contaminants adhered to the surface and interior of the optical system are severed by the intense energy of the exposure light rays. As a result the contaminants are broken down, vaporized, and removed.

According to a second aspect of the present invention, there is provided another cleaning method for an aligner. This cleaning method includes providing a reflecting plate in a position in which an object to be treated is normally disposed, for reflecting light emitted from a projection lens. The cleaning method also includes removing contaminants that are adhered to the projection lens and an optical system by irradiating the projection lens with the light rays reflected by the reflecting plate.

The exposure light rays from the light source are introduced to the reflecting plate via the optical system. The light rays enter the reflecting plate, and are diffused or converged by the reflecting plate and then emitted onto the projection lens. Hence the peripheral portion and interior of the optical system and projection lens, to which the exposure light rays are not transmitted during normal exposure, are irradiated with the light rays. Thus the molecular bonds of contaminants adhered to the surface and interior of the optical system and projection lens are severed by the intense energy of the exposure light rays. As a result the contaminants are broken down, vaporized, and removed.

According to a third aspect of the present invention, there is provided still another cleaning method for an aligner. This cleaning method includes providing an illumination lens on a stage of the aligner. The stage carries an object to be treated. The cleaning method also includes guiding a part of exposure light rays from a light source to the illumination lens. The cleaning method also includes cleaning a projection lens and an optical system by irradiating the projection lens with the exposure light rays guided to the illumination lens.

According to a fourth aspect of the present invention, there is provided another cleaning method for an aligner. This cleaning method includes providing a reflecting plate in place of the exposure mask. The cleaning method also includes guiding a part of exposure light rays from a light source to the reflecting plate. The cleaning method also includes cleaning an optical system or a projection lens by reflecting the exposure light rays guided to the reflecting plate toward the optical system or the projection lens.

According to a fifth aspect of the present invention, there is provided yet another cleaning method for an aligner. This cleaning method Includes providing a light emission unit in place of the exposure mask, and guiding a part of exposure light rays from a light source to the light emission unit. The cleaning method also includes cleaning an optical system or a projection lens by irradiating the optical system or the projection lens with the exposure light rays guided to the light emission unit.

These and other objects, aspects and advantages of the present invention will become apparent to those skilled in the art from the following detailed description and appended claims when read and understood in conjunction with the accompanying drawings.

DESCRIPTION OF THE PREFERRED EMBODIMENTS

First Embodiment

Figure 1A:
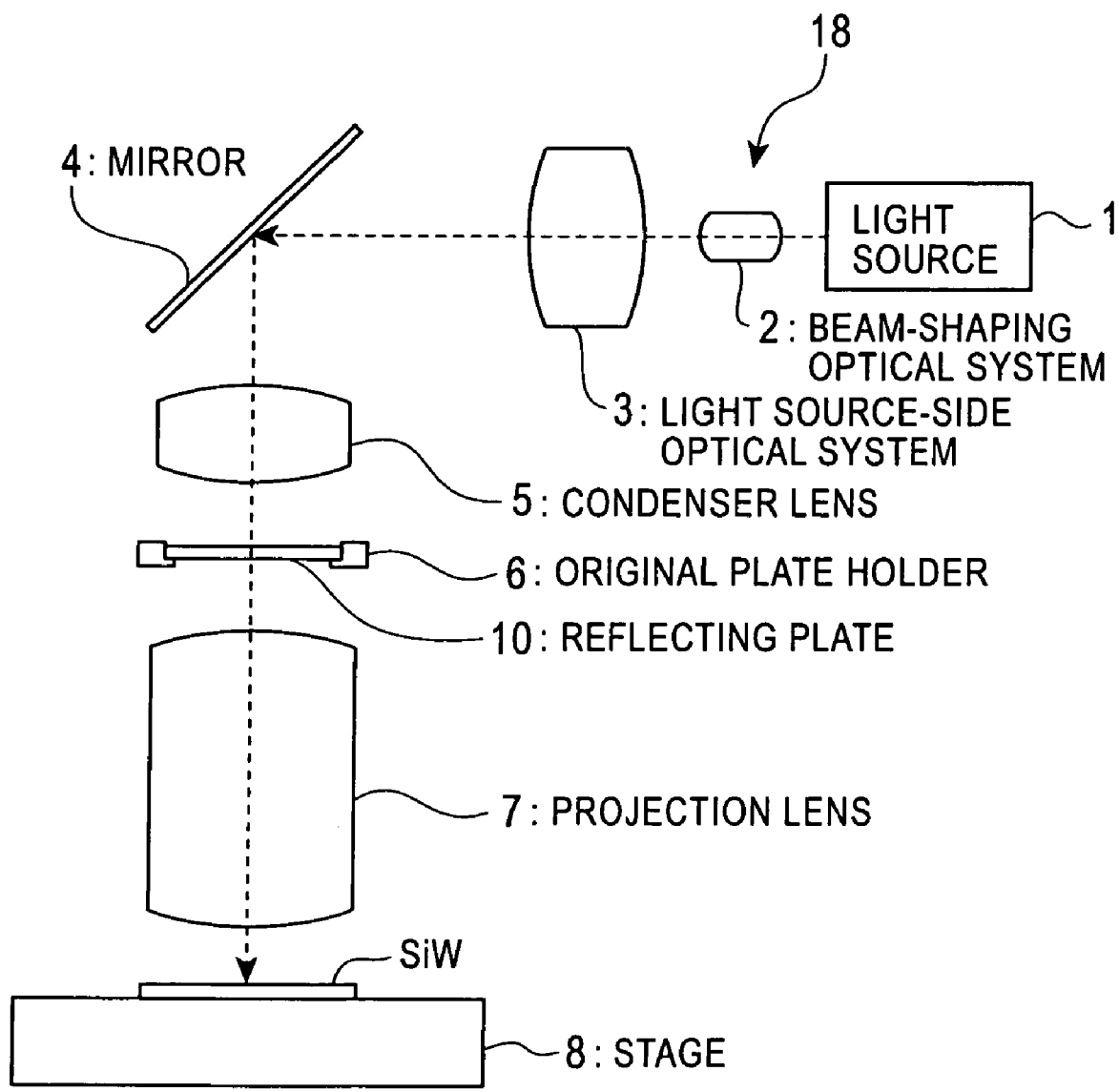
FIG. 1A shows a structure of an aligner used in a self-cleaning method according to a first embodiment of the present invention.
Figure 1B:
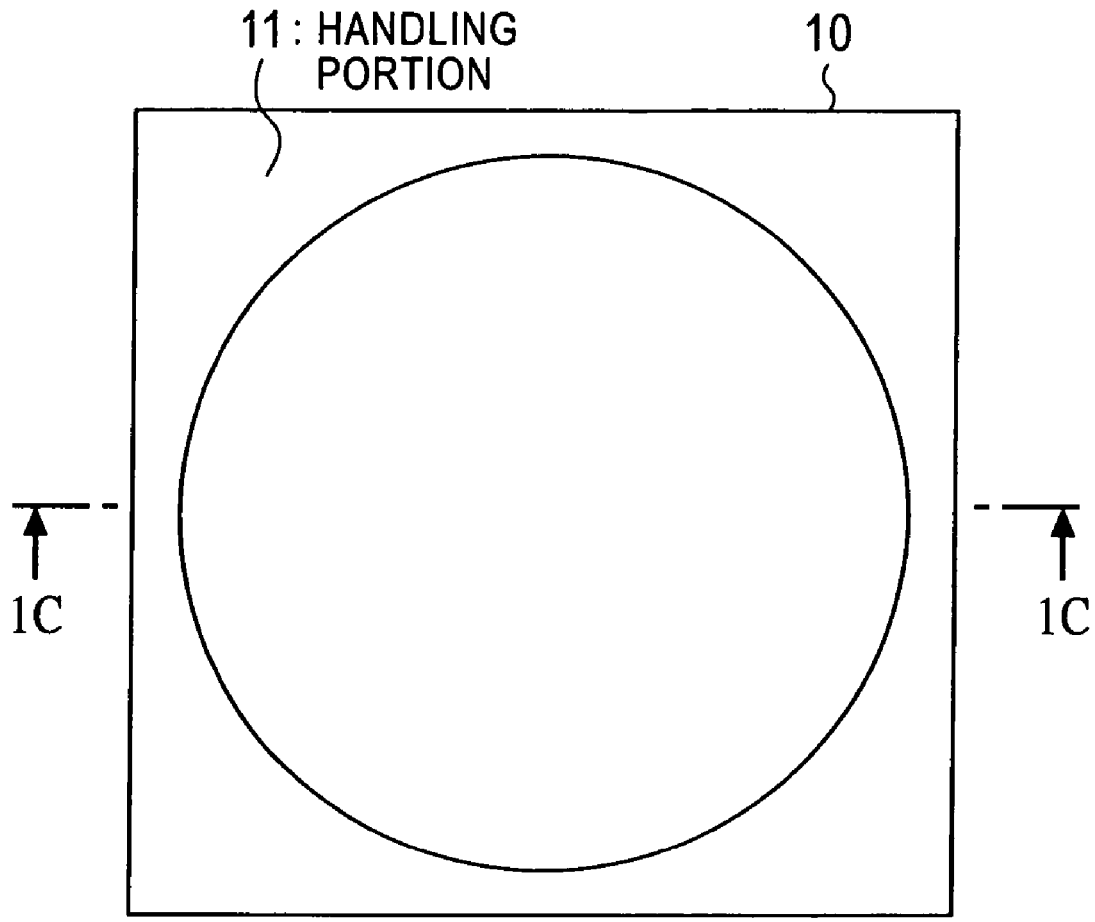
FIG. 1B shows a plan view of a reflecting plate used during self-cleaning.
Figure 1C:
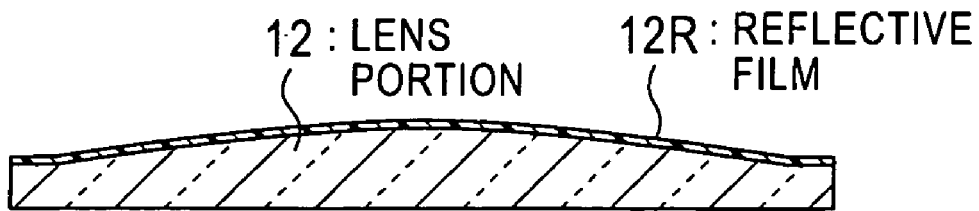
FIG. 1C is a cross-sectional view taken along the line 1C-1C in FIG. 1B.

Referring to FIGS. 1A to 1C, a self-cleaning method for an aligner according to a first embodiment of the present invention will be described.

As shown in FIG. 1A, this aligner 18 has an exposure light source 1 which emits extremely short wavelength ultraviolet rays such as ArF Excimer light with a wavelength of 193 nm or F2 light with a wavelength of 157 nm. A beam-shaping optical system 2 and a light source-side optical system 3 are disposed on the output side of the light source 1, and a mirror 4 is provided on the output side of the light source-side optical system 3. The mirror 4 alters the optical path of the ultraviolet rays by ninety degrees so that the ultraviolet rays are guided to a condenser lens 5. The ultraviolet rays are then output as uniform parallel rays from the condenser lens 5. An original plate (master plate) holder 6 is provided on the output side of the condenser lens 5 for mounting an exposure mask.

A projection lens 7 for accurately reducing a circuit pattern formed on the exposure mask and projecting the reduced circuit pattern onto the surface of an object to be treated is disposed on the output side of the original plate holder 6. A stage 8 for carrying a semiconductor wafer W, which serves as the object to be treated, and moving the semiconductor wafer W relative to the projection lens 7 is provided after (downstream of) the projection lens 7.

A reflecting plate 10 shown in FIGS. 1B and 1C is set in the original plate holder 6 in place of the exposure mask when self-cleaning of the aligner 18 shown in FIG. 1A is performed. The reflecting plate 10 has the same dimensions (for example, a square with a thickness of 5 mm and a length along one side of approximately 150 mm) as the exposure mask used during exposure treatment, and is made from substantially the same material (silica glass, for example) as the exposure mask. It should be noted, however, that reflecting plate 10 has some differences from the exposure mask. Specifically, the surface of the reflecting plate 10, except for a peripheral handling portion 11, is provided with a lens portion 12 which forms a convex lens with a diameter of approximately 130 mm, for example, and the surface of the lens portion 12 is coated with a reflective film 12R formed from a metal such as Cr. The back surface and peripheral handling portion 11 of the reflecting plate 10 are formed flat. The handling portion 11 in particular may be treated in the same manner as a normal exposure mask during mask conveyance in the aligner 18.

Next, an operation of the aligner 18 will be described.

During normal exposure, an exposure mask having a predetermined circuit pattern is set in the original plate holder 6, the semiconductor wafer W is placed on the stage 8, and ultraviolet rays are emitted from the light source 1. The light rays from the light source 1 are formed into uniform parallel rays by the beam-shaping optical system 2, light source-side optical system 3, mirror 4, and condenser lens 5, and then emitted onto the exposure mask. Having passed through the exposure mask, the parallel ultraviolet rays enter the projection lens 7.

The projection lens 7 reduces the circuit pattern on the exposure mask and projects the reduced circuit pattern onto the semiconductor wafer W. The stage 8 is moved and stopped repeatedly, and a shutter (not shown) is opened and closed at each stop position, thereby exposing the circuit pattern to the surface of the semiconductor wafer W. Thus, a plurality of same circuit patterns can be exposed onto the semiconductor wafer W.

When contaminants on the light source side, including the condenser lens 5, are to be cleaned away from the aligner 18, the exposure mask is removed, and in its place, the reflecting plate 10 is mounted in the original plate holder 6 such that the reflective film 12R on the upper surface (convex surface side) of the reflecting plate 10 faces the condenser lens 5. Ultraviolet rays are then irradiated from the light source 1. The ultraviolet rays from the light source 1 are formed into uniform parallel rays by the beam-shaping optical system 2, light source-side optical system 3, mirror 4, and condenser lens 5, and introduced to the reflecting plate 10.

The ultraviolet rays emitted onto the reflecting plate 10 are reflected by the reflective film 12R, which forms a convex mirror on the surface of the reflecting plate 10, and are thereby refracted and diffused to the outside so as to illuminate the entire surface of the condenser lens 5. Accordingly, the molecular bonds of the contaminants adhered to the surface of the condenser lens 5 are severed by the intense energy of the ultraviolet rays consequently, the contaminants are broken down, vaporized, and removed.

The ultraviolet rays which enter the condenser lens 5 travel along a unique path which Is different from the optical path used during normal exposure, and as a result illuminate the interior of the condenser lens 5, the mirror 4 and the light source-side optical system 3 in a different direction from a direction during normal exposure. Hence, contaminants existing on this path are removed.

In the aligner self-cleaning method of the first embodiment, the reflecting plate 10, the surface of which is coated with the reflective film 12R forming a convex mirror, is provided in the original plate holder 6, and extremely short wavelength ultraviolet rays that enter the condenser lens 5 as parallel rays from the light source side are diffused to the outside so as to illuminate the entire surface of the condenser lens 5. As a result, locations that are not irradiated with ultraviolet rays during normal exposure can be irradiated with the optical cleaning ultraviolet rays. This achieves effective self-cleaning of the condenser lens 5 and other elements. The handling portion 11 of the reflecting plate 10 is flat so that the mirror surface portion of the reflecting plate 10 does not come into contact with the original plate holder 6. Thus, the reflecting plate 10 can be handled in the same manner as the normal exposure mask. This enables accurate positioning of the reflecting plate 10, and does not cause reduction in the reflection efficiency.

If the reflecting plate 10 is turned over so that the convex reflective film 12R faces the projection lens 7, the reflecting plate 10 becomes a concave mirror when seen from the light source 1 side. When ultraviolet rays are emitted from the light source 1 in this state, the ultraviolet rays are transmitted through the silica glass of the reflecting plate 10 and reflected by the back surface of the reflective film 12R. As a result, the ultraviolet rays converge centrally, and are thus emitted in a concentrated fashion onto the central portion of the condenser lens 5. Hence the central portion of the condenser lens 5, which is the most influential location during normal exposure treatment, can be subjected to intensive self-cleaning.

Second Embodiment

Figure 2A:
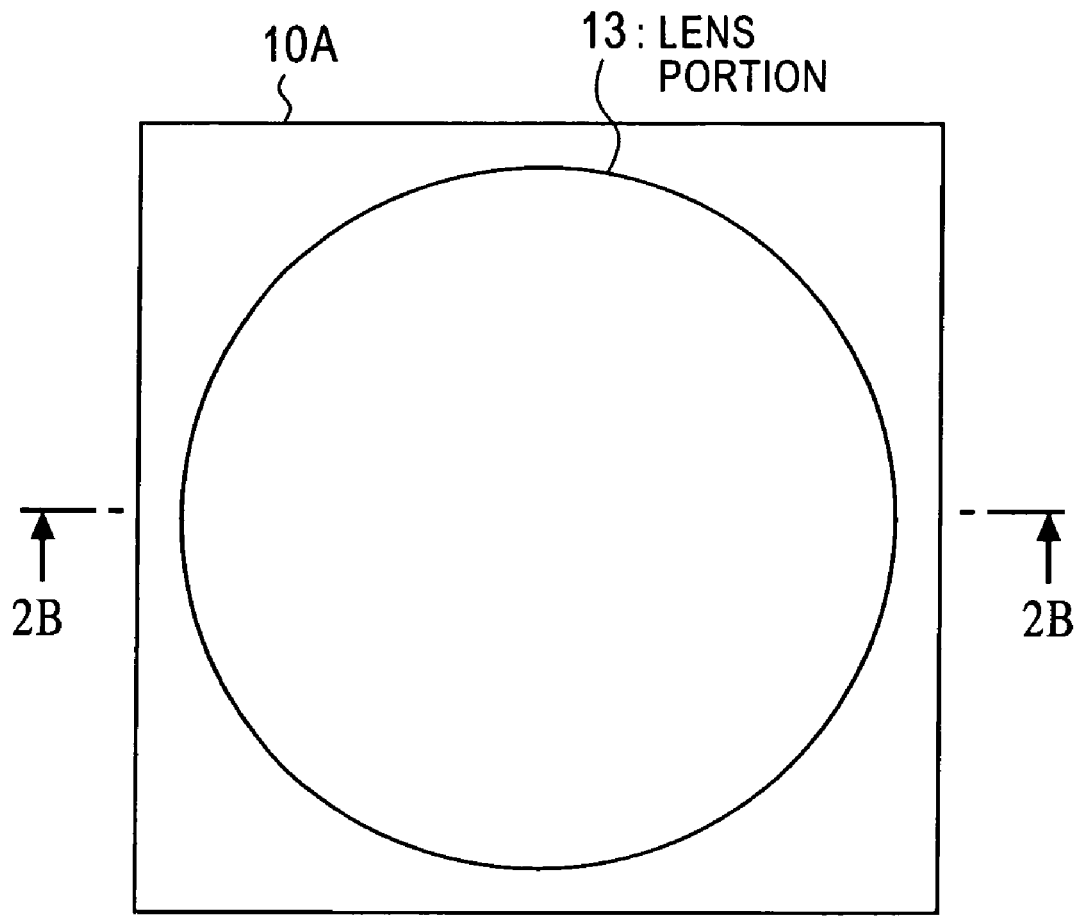
FIG. 2A illustrates a plan view of a reflecting plate according to a second embodiment of the present invention.
Figure 2B:
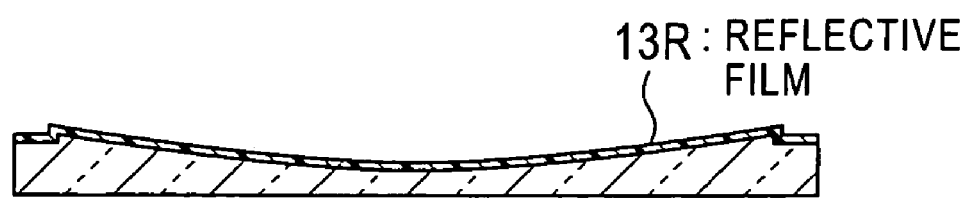
FIG. 2B illustrates a cross-sectional view taken along the line 2B-2B in FIG. 2A.

Referring to FIGS. 2A and 2B, a reflecting plate 10A according to a second embodiment of the present invention will be described. FIG. 2A is a plan view of the reflecting plate 10A, and FIG. 2B is a cross-sectional view taken along the line 2B-2B which extends along the central line of the reflecting plate 10A.

The reflecting plate 10A is used for the same purpose as the reflecting plate 10 shown in FIG. 1B, but is provided with a concave lens portion 13 instead of the convex lens portion 12 of the reflecting plate 10. The surface of the lens portion 13 is coated with a reflective film 13R.

By setting the reflecting plate 10A such that the reflective film 13R faces the condenser lens 5, the central portion of the condenser lens 5 can be subjected to intensive self-cleaning. By setting the reflective film 13R to face the projection lens 7, the reflecting plate 10A takes the form of a convex mirror when seen from the light source 1 side, and hence the entire surface of the condenser lens 5 can be irradiated with ultraviolet rays. Thus the same advantages as those of the first embodiment are exhibited.

Third Embodiment

Figure 3A:
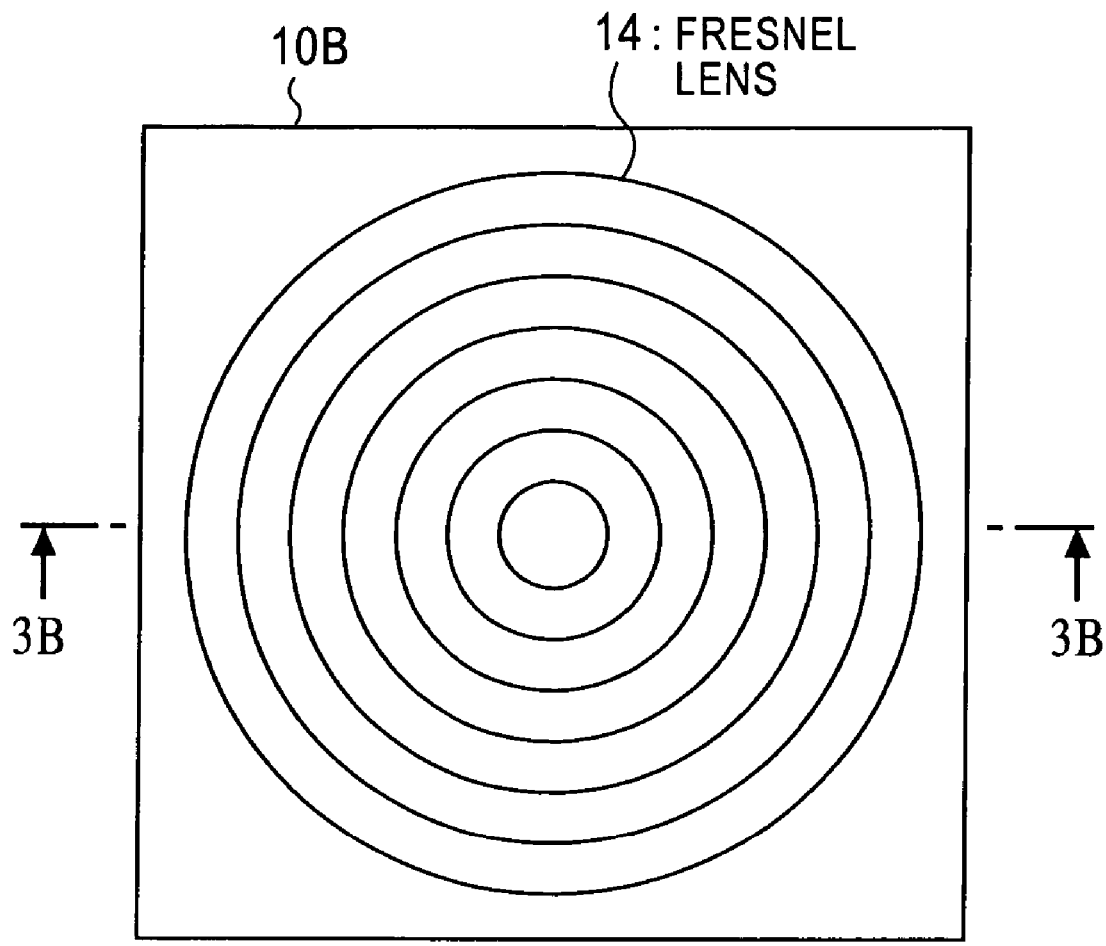
FIG. 3A illustrates a plan view of a reflecting plate according to a third embodiment of the present invention.
Figure 3B:
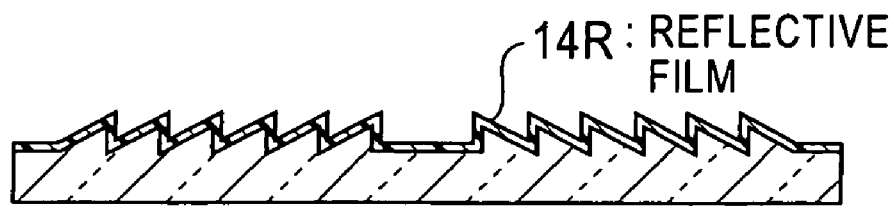
FIG. 3B is a cross-sectional view taken along the line 3B-3B in FIG. 3A.

Referring to FIGS. 3A and 3B, a reflecting plate 10B according to a third embodiment of the present invention will be described. FIG. 3A is a plan view, and FIG. 3B is a cross-sectional view taken along the line 3B-3B in FIG. 3A.

The reflecting plate 10B is used with the same aim as the reflecting plate 10 shown in FIG. 1B, but a Fresnel lens 14 is formed on the surface in place of the lens portion 12 of the reflecting plate 10. The Fresnel lens has a plurality of annular convex lens segments disposed concentrically. The surface of this Fresnel lens 14 is coated with a reflective film 14R.

The material and dimensions of the reflecting plate 10B are identical to those of the reflecting plate 10 shown in FIGS. 1B and 1C. The reflecting plate 10B may be manufactured by cutting concentric grooves in the surface of a square silica glass plate having a thickness of 5 mm and a length along one side of approximately 150 mm, so that the cross-section of the plate takes a serrated form, and then coating the surface of the plate with the reflective film 14R. Alternatively, the reflecting plate 10B may be manufactured by adhering a Fresnel lens or the like formed from a heat-resistant, transparent resin to the plate.

By setting the reflecting plate 10B such that the reflective film 14R faces the condenser lens 5, the reflecting plate 10B takes the form of a convex mirror when seen from the light source 1 side, and hence the entire surface of the condenser lens 5 can be irradiated with ultraviolet rays. By setting the reflective film 14R to face the projection lens 7, the reflecting plate 10B takes the form of a concave mirror when seen from the light source 1 side, and hence the central portion of the condenser lens 5 can be irradiated with the ultraviolet rays in a concentrated fashion.

Thus the reflecting plate 10B of the third embodiment exhibits a similar self-cleaning effect to that of the reflecting plate 10 of the first embodiment. Moreover, the focal distance of the reflecting plate 10B can be set freely without increasing the thickness of the reflecting plate 10B beyond the thickness of the reflecting plate 10.

Fourth Embodiment

Figure 4A:
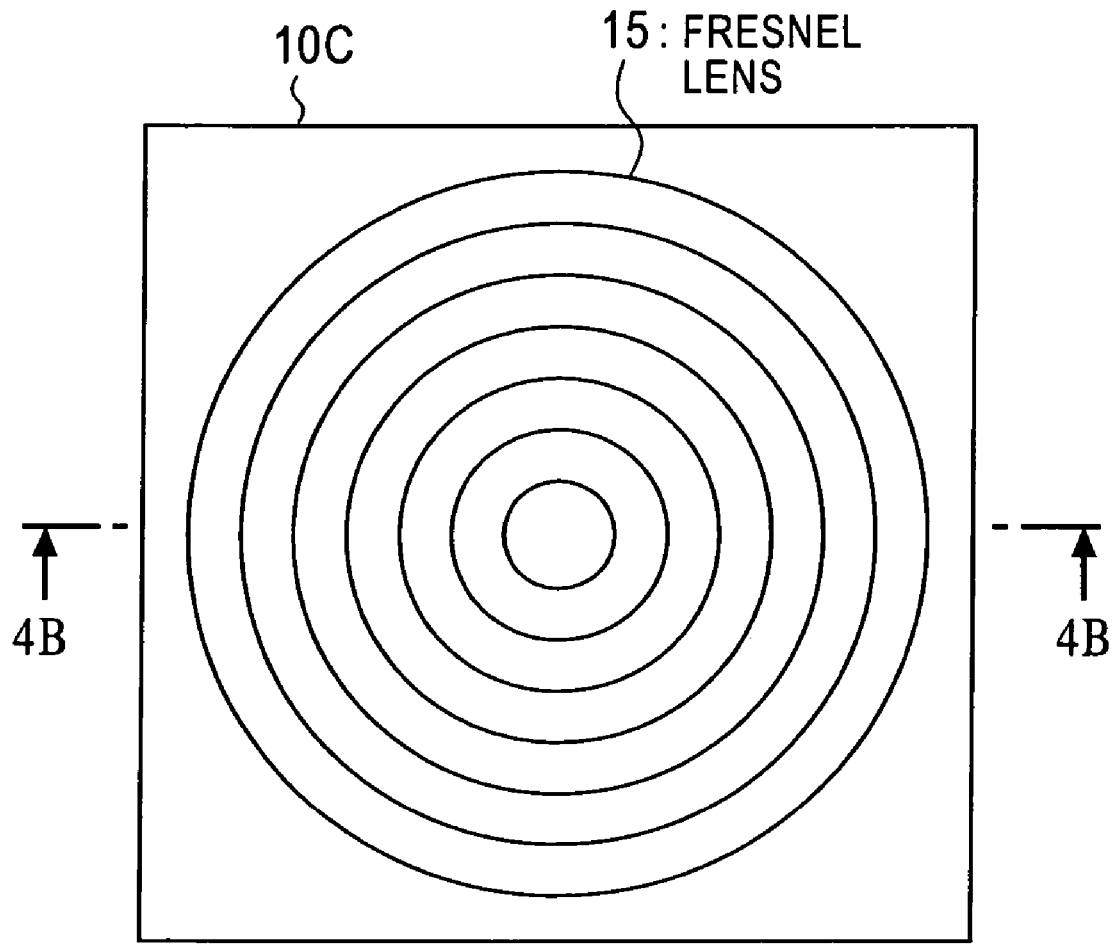
FIG. 4A shows a plan view of a reflecting plate according to a fourth embodiment of the present invention.
Figure 4B:
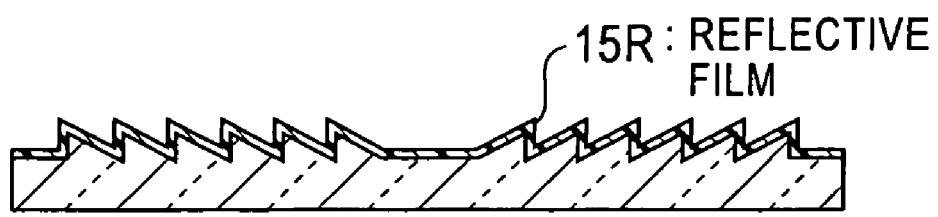
FIG. 4B is a cross-sectional view taken along the line 4B-4B in FIG. 4A.

Referring to FIGS. 4A and 4B, a reflecting plate 10C according to a fourth embodiment of the present invention will be described. FIG. 4A is a plan view, and FIG. 4B is a cross-sectional view.

The reflecting plate 10C is used with the same aim as the reflecting plate 10 shown in FIG. 1B, but a Fresnel lens 15 is formed on the surface in place of the lens portion 12 of the reflecting plate 10. The Fresnel lens 15 has a plurality of annular concave lens segments disposed concentrically. The surface of this Fresnel lens 15 is coated with a reflective film 15R.

By setting the reflecting plate 10C such that the reflective film 15R faces the condenser lens 5 the reflecting plate 10C takes the form of a concave mirror when seen from the light source 1 side, and hence the central portion of the condenser lens 5 can be irradiated with the ultraviolet rays in a concentrated fashion. By setting the reflective film 15R to face the projection lens 7, the reflecting plate 10C takes the form of a convex mirror when seen from the light source 1 side, and hence the entire surface of the condenser lens 5 can be irradiated with ultraviolet rays.

Thus the reflecting plate 10C of the fourth embodiment exhibits a similar self-cleaning effect to that of the reflecting plate 10A of the second embodiment, and has the same advantages as the third embodiment.

Fifth Embodiment

Figure 5A:
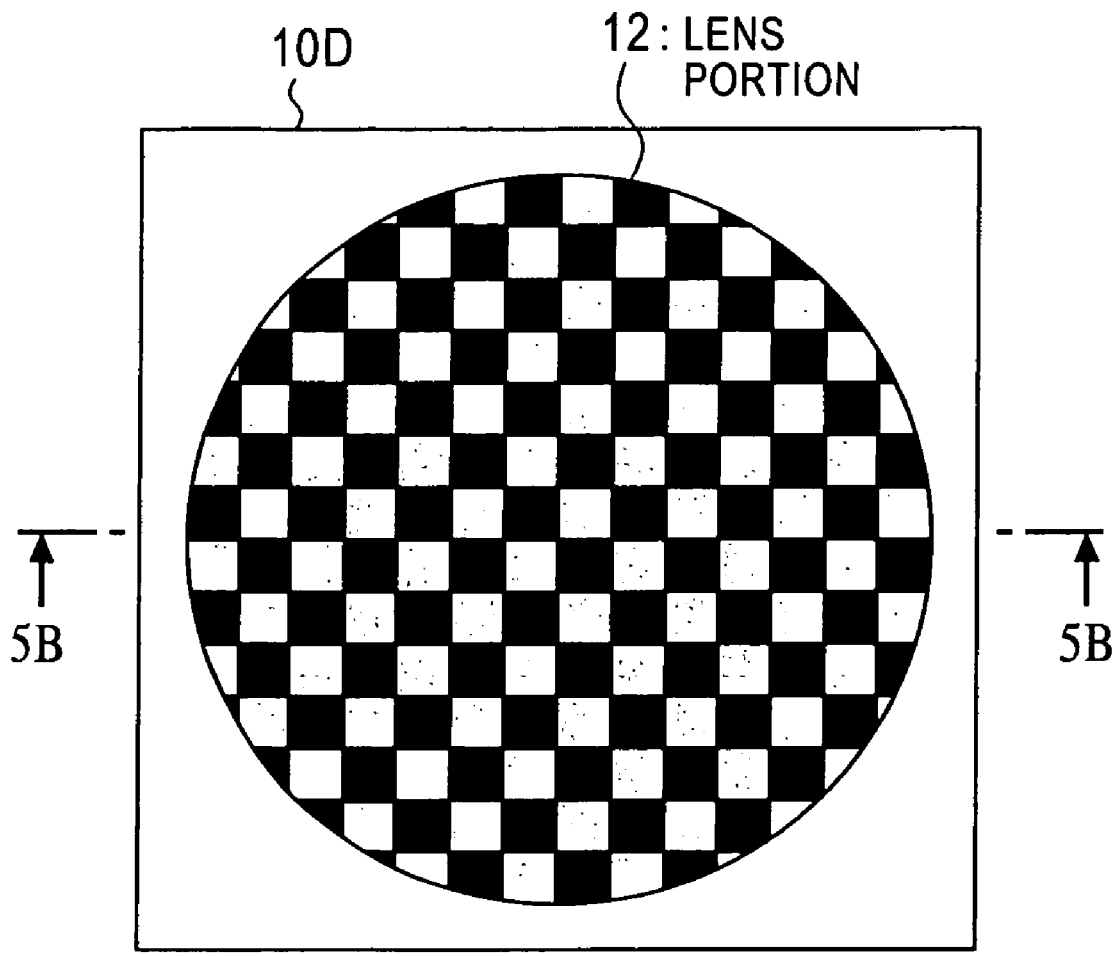
FIG. 5A shows a plan view of a reflecting plate according to a fifth embodiment of the present invention.
Figure 5B:
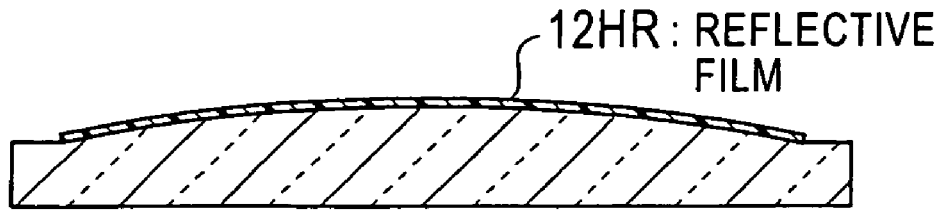
FIG. 5B Is a cross-sectional view taken along the line 5B-5B in FIG. 5A.

Referring to FIGS. 5A and 5B, a reflecting plate 10D according to a fifth embodiment of the present invention will be described. FIG. 5A is a plan view, and FIG. 5B is a cross-sectional view.

The reflecting plate 10D is coated with a reflective film 12HR instead of the reflective film 12R of the reflecting plate 10 shown in FIGS. 1B and 1C. The reflective film 12HR reflects a part (substantially half, for example) of the light rays, and transmits the remainder of the light rays. The reflective film 12HR may have a checkered pattern as shown in FIG. 5A, or may be a half mirror onto which an extremely thin reflective film is applied through vapor deposition.

When the reflecting plate 10D is used, a part of the ultraviolet rays emitted from the light source 1 is reflected and diffused by the reflective film 12HR and thus introduced onto the entire surface of the condenser lens 5. Meanwhile, the remaining ultraviolet rays pass through the reflective film 12HR, converge, and illuminate the central portion of the projection lens 7 in a concentrated fashion. Hence, the entire surface of the condenser lens 5 and the central portion of the projection lens 7 can be irradiated with the ultraviolet rays simultaneously. This enables locations that are not irradiated with ultraviolet rays during normal exposure to be subjected to simultaneous self-cleaning.

By turning the reflecting plate 10D over, the central portion of the condenser lens 5 and the entire surface of the projection lens 7 may be irradiated with the ultraviolet rays simultaneously.

It should be noted that the reflective film 13R, 14R, 15R of the reflecting plate shown in FIG. 2A, 3A, 4A may be replaced by the reflective film 12HR such that substantially half of the light rays are reflected and the remaining light rays are transmitted by the reflective film. Then, the second, third and fourth embodiments can have a similar advantage to that of the fifth embodiment.

Sixth Embodiment

Figure 6:
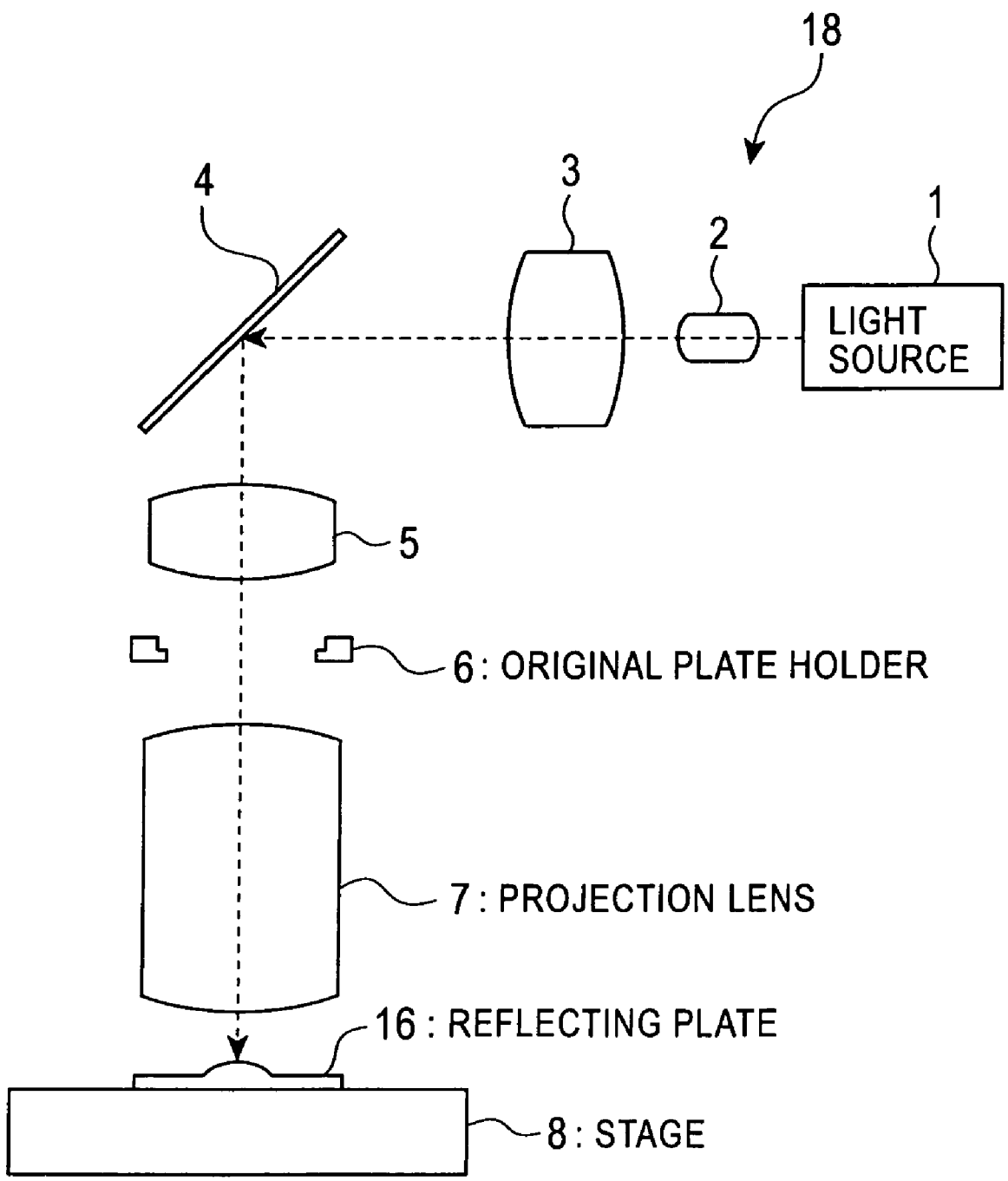
FIG. 6 is a schematic diagram of an aligner which is used in a self-cleaning method according to a sixth embodiment of the present invention.

Referring to FIG. 6, a self-cleaning method for an aligner 18 according to a sixth embodiment of the present invention will be described. Identical elements to those shown in FIGS. 1A to 1C have been allocated identical reference numerals.

In this self-cleaning method, nothing is set in the original plate holder 6; instead, a reflecting plate 16 is set on the exposure surface of the stage 8.

The reflecting plate 16 is made from an Si substrate or the like. The reflecting plate 16 is made from the same material as the semiconductor wafer. The surface of a circular area of the Si substrate, which includes the entire surface of the Si substrate or an exposure area (a central 25 mm×33 mm rectangle, for example) of the Si substrate, is polished into a convex form, and the surface of this convex form is coated with a reflective film through vapor deposition of Al or the like.

After the reflecting plate 16 is mounted on the stage 8, ultraviolet rays are emitted from the light source 1. The ultraviolet rays from the light source 1 pass through the beam-shaping optical system 2, light source-side optical system 3, mirror 4, condenser lens 5, and projection lens 7, and are emitted onto the surface of the reflecting plate 16 placed on the stage 8.

The ultraviolet rays emitted onto the reflecting plate 16 are reflected by the reflective film which forms a convex mirror on the surface of the reflecting plate 16, refracted and scattered to the outside, and thus emitted onto the entire surface of the projection lens 7. As a result, the molecular bonds of the contaminants adhered to the surface of the projection lens 7 are severed by the intense energy of the ultraviolet rays, and thus the contaminants are broken down, vaporized, and removed.

The ultraviolet rays which enter the projection lens 7 travel along a different path to the optical path used during normal exposure, and as a result illuminate the interior of the projection lens 7, the condenser lens 5, the mirror 4, the light source-side optical system 3, and so on. Hence, contaminants existing on this path are removed.

By moving the stage 8 on which the reflecting plate 16 is placed, the emission angle of the ultraviolet rays onto the projection lens 7 can be changed (adjusted) so that each portion can be irradiated evenly by the ultraviolet rays.

In the aligner self-cleaning method of the sixth embodiment, therefore, the reflecting plate 16, which serves as a convex mirror, is provided on the exposure surface of the stage 8, and hence effective and desired self-cleaning of the entire stage-side surface of the projection lens 7 in particular can be achieved.

If a reflecting plate forming a concave mirror, such as that shown in FIG. 2A, is used instead of the reflecting plate 16 forming a convex mirror, the central portion of the stage-side surface of the projection lens 7 can be irradiated with the ultraviolet rays in a concentrated fashion. If a Fresnel lens-type reflecting plate such as that shown in FIG. 3A or FIG. 4A is used, the focal distance can be decided arbitrarily without increasing the thickness of the reflecting plate.

Seventh Embodiment

Figure 7:
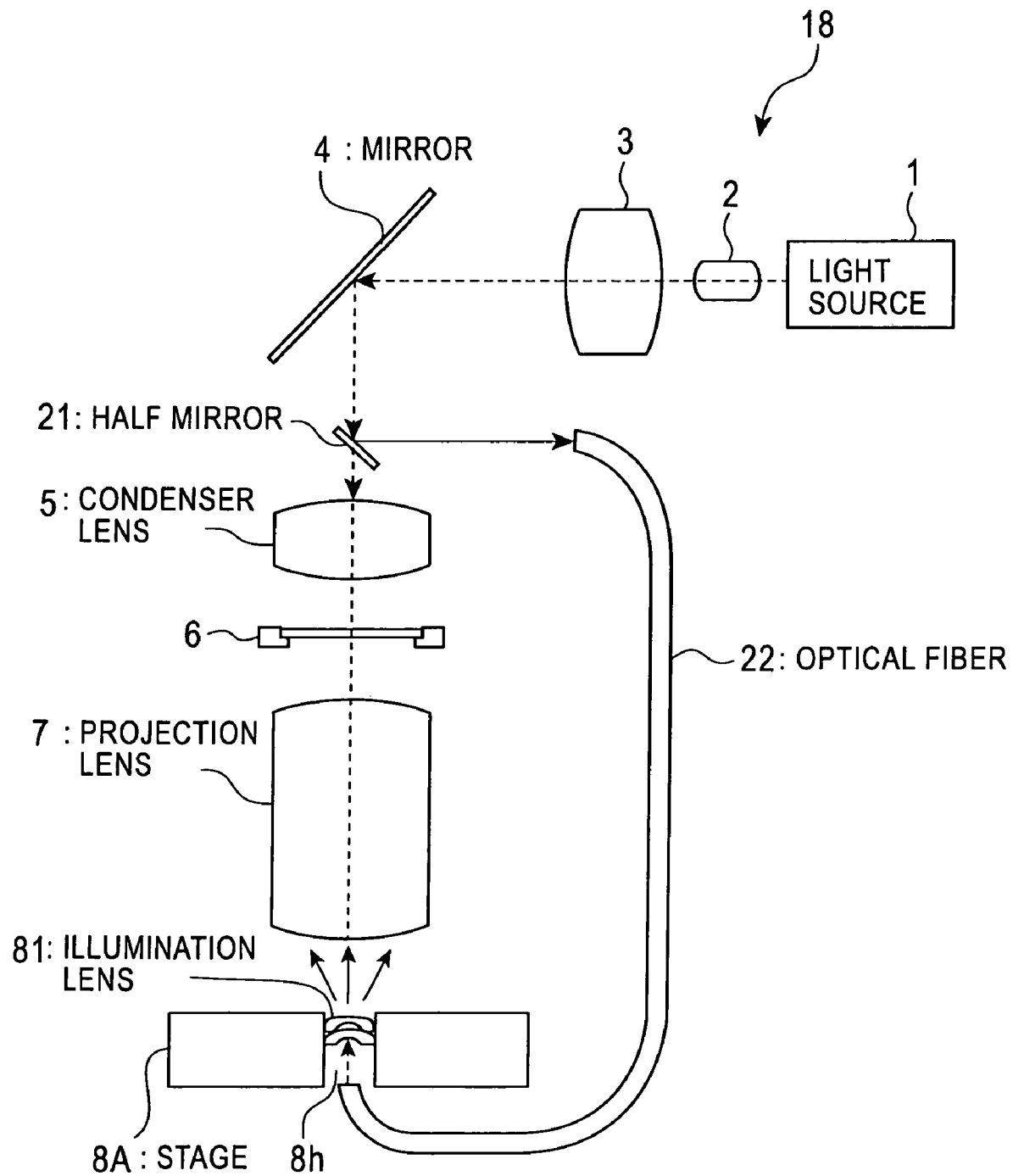
FIG. 7 is a schematic diagram of an aligner which is used in a self-cleaning method according to a seventh embodiment of the present invention.

Referring to FIG. 7, a self-cleaning method for an aligner 18 according to a seventh embodiment of the present invention will be described. Identical elements to those shown in FIG. 1A have been allocated identical reference numerals.

In this self-cleaning method, a different stage 8A to the stage 8 shown in FIG. 1A is used. The stage 8A has one or a plurality of opening portions 8h for introducing ultraviolet rays from the lower side of the stage 8A. An illumination lens 81 for irradiating the stage-side surface of the projection lens 7 with the ultraviolet rays is disposed at the upper end of each opening portion 8h.

A half mirror 21 is provided in an arbitrary position (between the mirror 4 and projection lens 7 in the illustrated embodiment) on the optical path extending from the outlet of the light source 1 to the inlet into the projection lens 7. The ultraviolet rays reflected by the half mirror 21 are guided to each opening portion 8h in the stage 8A by an optical fiber 22.

Therefore, a part of the ultraviolet rays emitted from the light source 1 is guided into the optical fiber(s) 22 via the half mirror 21, and then guided to the opening portion(s) 8h in the stage 8A by the optical fiber 22. Then, the ultraviolet rays transmit through the illumination lens(es) 81 and reach the surface of the projection lens 7. If a zoom lens is used as the illumination lens 81 of the stage 8A, the emission range of the ultraviolet rays onto the projection lens 7 can be adjusted.

In the aligner self-cleaning method of the seventh embodiment, the stage 8A having one or more openings 8h and associated illumination lenses 81 for emitting ultraviolet rays is used, and hence the surface of the projection lens 7 can be irradiated with ultraviolet rays in a similar manner to the sixth embodiment. Thus the seventh embodiment can have similar advantages to those of the sixth embodiment.

Eighth Embodiment

Figure 8:
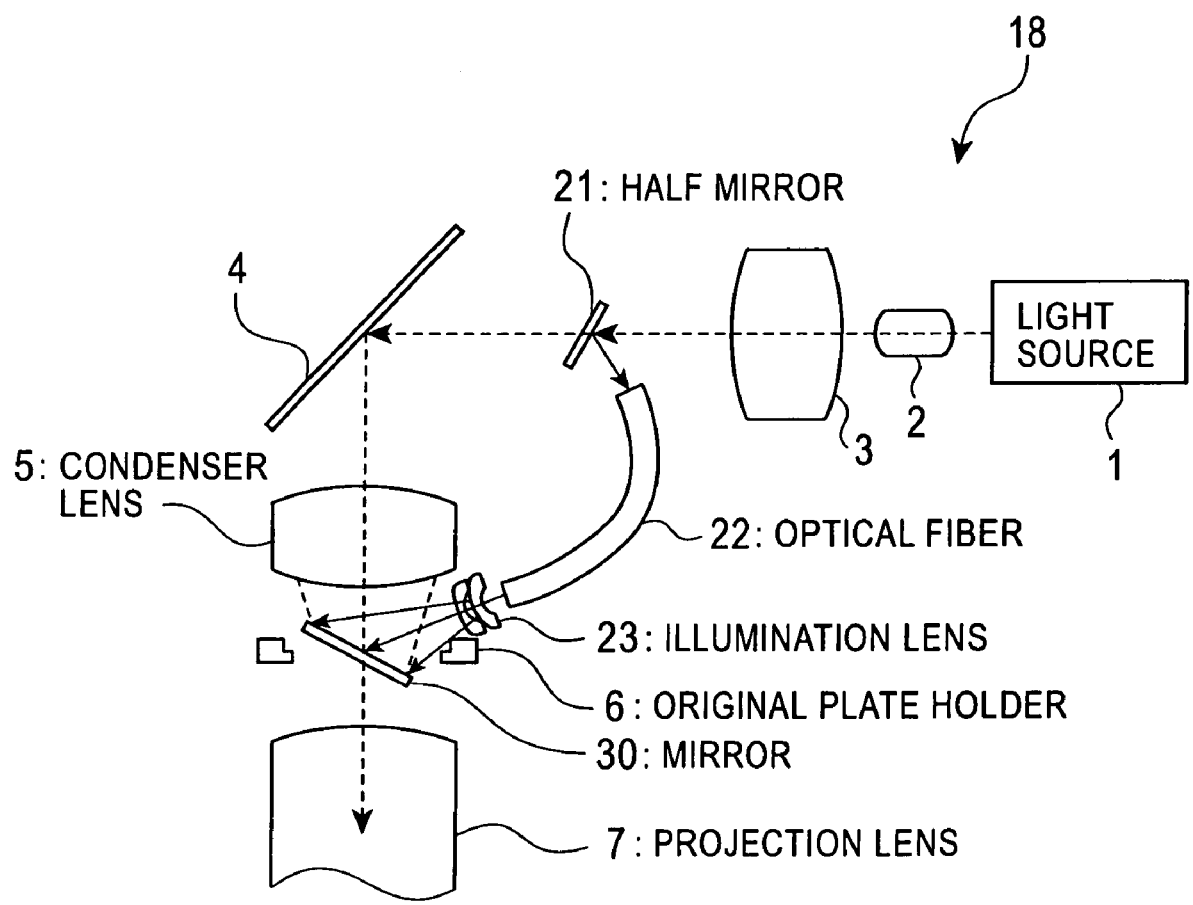
FIG. 8 is a schematic diagram of an aligner which is used in a self-cleaning method according to an eighth embodiment of the present invention.

Referring to FIG. 8, a self-cleaning method for an aligner 18 according to an eighth embodiment of the present invention will be described. Same elements as those shown in FIG. 7 have been allocated identical reference numerals.

In this self-cleaning method, a flat mirror 30 is set in the original plate holder 6. Similar to FIG. 7, a part of the ultraviolet rays from the light source 1 is reflected by the half mirror 21 and introduced into the optical fiber 22. Then, the ultraviolet rays are emitted onto the mirror 30 via an illumination lens 23, The ultraviolet rays are then reflected by the mirror 30 and emitted onto the surface of the condenser lens 5. By altering the angle (posture) of the mirror 30, the emission range of the ultraviolet rays onto the condenser lens 5 can be adjusted.

In the aligner self-cleaning method of the eighth embodiment, the mirror 30 for emitting ultraviolet rays is mounted on the original plate holder 6, and the ultraviolet rays of the light source 1 are guided to the mirror 30 by the optical fiber 22. Thus similar effects to those of the first embodiment are obtained.

It should be noted that by altering the angle of the mirror 30, the surface of the projection lens 7 can be irradiated with the ultraviolet rays reflected by the mirror 30.

The mirror 30 is a plane mirror in FIG. 8, but a concave mirror or convex mirror may be used.

Ninth Embodiment

Figure 9:
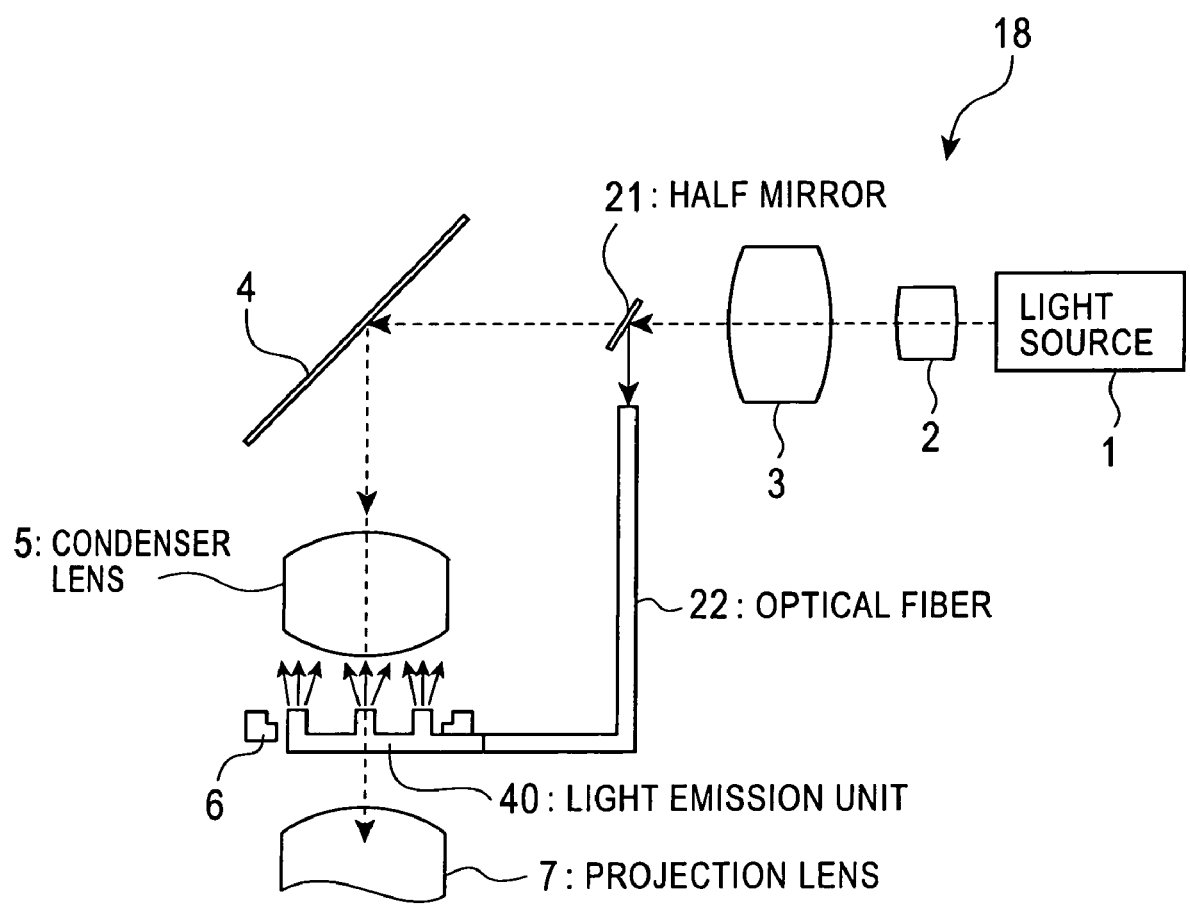
FIG. 9 is a schematic diagram of an aligner which is used in a self-cleaning method according to a ninth embodiment of the present invention.

Referring to FIG. 9, a self-cleaning method for an aligner 18 according to a ninth embodiment of the present invention will be described. Same elements as those shown in FIG. 8 have been allocated identical reference numerals.

In this self-cleaning method, a light emission unit 40 for emitting ultraviolet rays is supported by the original plate holder 6. The light emission unit 40 is connected to the downstream end of the optical fiber 22. The light emission unit 40 has a single inlet and a plurality of outlets. An illumination lens is provided at each outlet of the light emission unit 40.

Similar to FIG. 7, a part of the ultraviolet rays from the light source 1 is reflected by the half mirror 21 and introduced into the optical fiber 22. The light emission portion 40 is constituted such that the ultraviolet rays passing through the optical fiber 22 are branched and emitted through the illumination lenses. By directing the illumination lenses of the light emission portion 40 (i.e., the outlets of the light emission portion 40) toward the condenser lens 5, the surface of the condenser lens 5 can be irradiated with the ultraviolet rays, and by directing the illumination lenses toward the projection lens 7, the surface of the projection lens 7 can be irradiated with the ultraviolet rays. As a result, similar effects to those of the eighth embodiment are obtained.

Tenth Embodiment

Individual modifications to the first through ninth embodiments are described above in the description of each embodiment. Here, modifications that are common to the several embodiments will be described.

(1) The reflective film of the reflecting plate used in the first through sixth embodiments may be formed using a metal, other than Cr, such as Ti, Ta, Co, Hf, W, Al, Cu, or Mo, or an oxide, nitride, fluoride, or silicon compound of these metals, by means of coating using a method such as plating, vapor deposition, or sputtering. The reflective film is not limited to a single layer structure, and a multi-layer structure may be employed.

(2) A reflective film which reflects a part of the light rays and transmits the remaining light rays is employed in the fifth embodiment. A similar reflective film may be used in the reflecting plate of the second, third or fourth embodiment.

(3) In the seventh through ninth embodiments, a part of the ultraviolet rays is extracted by the half mirror disposed on the optical path extending from the light source 1 to the condenser lens 5, but any reflecting mirror may be used if the reflecting mirror can be put (moved) into the optical path during self-cleaning.

(4) In the seventh through ninth embodiments, an optical fiber is used to guide a part of the ultraviolet rays emitted from the light source 1 as cleaning ultraviolet rays, but one or more mirrors and/or lenses may be used instead of the optical fiber.

(5) In the seventh through ninth embodiments, a part of the ultraviolet rays from the light source 1 is extracted by the half mirror and optical fiber as cleaning light, but another light source which outputs ultraviolet rays to be used in the cleaning operation may be provided.

This application is based on a Japanese Patent Application No. 2004-338573 filed on Nov. 24, 2004 and the entire disclosure thereof is incorporated herein by reference.

What is claimed is:

1. A self-cleaning method for an aligner, the aligner including a light source for outputting exposure light rays, an optical system for guiding said light rays from said light source to an exposure mask that has an exposure pattern and that is held by a holder, and a projection lens for projecting said exposure pattern onto an object to be treated, said self-cleaning method comprising:
    removing said exposure mask from said holder;
    placing a reflecting plate in said holder to reflect said light rays back to said optical system; and
    cleaning said optical system by irradiating said optical system with said light rays reflected by said reflecting plate.

2. The self-cleaning method for an aligner according to claim 1, wherein said reflecting plate includes a silica glass plate having a convex lens portion on a surface thereof, or a silica glass plate having a plurality of annular convex lens segments disposed concentrically on said surface thereof,
    said surface of said silica glass plate being coated with a reflective film.

3. The self-cleaning method for an aligner according to claim 1, wherein said reflecting plate includes a silica glass plate having a concave lens portion on a surface thereof, or a silica glass plate having a plurality of annular concave lens segments disposed concentrically on said surface thereof,
    said surface of said silica glass plate being coated with a reflective film.

4. The self-cleaning method for an aligner according to claim 2, wherein said reflecting plate is coated with the reflective film such that a part of said light rays is reflected and the remainder of said light rays is transmitted.

5. The self-cleaning method for an aligner according to claim 3, wherein said reflecting plate is coated with the reflective film such that a part of said light rays is reflected and the remainder of said light rays is transmitted.

6. An aligner comprising:
    a light source for outputting exposure light rays;
    an optical system for guiding said light rays from said light source to an exposure mask formed with an exposure pattern;
    a projection lens for projecting said exposure pattern onto an object to be treated; and
    a reflecting plate disposed in a position in which said exposure mask is normally disposed, for reflecting said light rays guided by said optical system toward said optical system to clean said optical system by said light rays.

7. The aligner according to claim 6, wherein said reflecting plate includes a silica glass plate having a convex lens portion on a surface thereof, or a silica glass plate having a plurality of annular convex lens segments disposed concentrically on said surface thereof,
    said lens portion or lens segments of said silica glass plate being coated with a reflective film.

8. The aligner according to claim 6, wherein said reflecting plate includes a silica glass plate having a concave lens portion on a surface thereof, or a silica glass plate having a plurality of annular concave lens segments disposed concentrically on said surface thereof,
    said lens portion or lens segments of said silica glass plate being coated with a reflective film.

9. The aligner according to claim 7, wherein said reflecting plate is coated with the reflective film such that a part of said light rays is reflected and the remainder of said light rays is transmitted.

10. The aligner according to claim 8, wherein said reflecting plate is coated with the reflective film such that a part of said light rays is reflected and the remainder of said light rays is transmitted.

11. The aligner according to claim 7, wherein said reflecting plate has a flat peripheral portion.

12. The aligner according to claim 6, wherein said light source emits ArF Excimer light with a wavelength of 193 nm or F2 light with a wavelength of 157 nm.

13. The self-cleaning method for an aligner according to claim 1, wherein the reflecting plate has a metallic reflecting surface.

14. The aligner of claim 6, wherein the reflecting plate has a metallic reflecting surface.

* * * * *